United States Patent
Sung et al.

(10) Patent No.: US 10,629,741 B1
(45) Date of Patent: Apr. 21, 2020

(54) METHOD AND DEVICE FOR SHALLOW TRENCH ISOLATION IN A FIN TYPE FIELD EFFECT TRANSISTORS

(71) Applicant: APPLIED Materials, Inc., Santa Clara, CA (US)

(72) Inventors: Min Gyu Sung, Essex, MA (US); Johannes Van Meer, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/175,494

(22) Filed: Oct. 30, 2018

(51) Int. Cl.
| | |
|---|---|
| H01L 21/8234 | (2006.01) |
| H01L 29/78 | (2006.01) |
| H01L 29/66 | (2006.01) |
| H01L 21/762 | (2006.01) |
| H01L 29/10 | (2006.01) |
| H01L 29/786 | (2006.01) |

(52) U.S. Cl.
CPC .... *H01L 29/7851* (2013.01); *H01L 21/76232* (2013.01); *H01L 29/1054* (2013.01); *H01L 29/66795* (2013.01); *H01L 29/78654* (2013.01)

(58) Field of Classification Search
CPC ................. H01L 29/785; H01L 21/823431
See application file for complete search history.

(56) References Cited

U.S. PATENT DOCUMENTS

2015/0187634 A1* 7/2015 Chiang ............... H01L 21/2636
257/401

* cited by examiner

*Primary Examiner* — Jae Lee

(57) ABSTRACT

A method of forming a semiconductor device may include providing a semiconductor device structure. The semiconductor device structure may include semiconductor fins pitched at a fin pitch on a substrate. The semiconductor device structure may include an isolation oxide layer on the substrate and between the semiconductor fins and a mask. The mask may be disposed over the isolation oxide layer and the mask may define at least one opening. The method may further comprise directing hot ions into the at least one opening, to implant hot ions in a volume of isolation oxide in the isolation oxide layer. The volume may be adjacent to at least one of the semiconductor fins.

7 Claims, 10 Drawing Sheets

METHOD AND DEVICE FOR SHALLOW TRENCH ISOLATION IN A FIN TYPE FIELD EFFECT TRANSISTORS

FIELD

The present embodiments relate to semiconductor device structures, and more particularly, to structures and processing for fin type field effect transistors.

BACKGROUND

As semiconductor devices scale to smaller dimensions, the ability to harness device improvements with decreased size becomes more challenging. The synthesis of three-dimensional semiconductor transistors, such as fin type field effect transistors (finFETs), involves challenging processing issues.

One challenge in scaling semiconductor devices relates to channel mobility. Fins typically provide transistor channels for finFET devices. Layout induced stress imposed on the fins in finFET devices can negatively impact channel mobility. Furthermore, the impact of the stress on channel mobility is inversely proportional to the number of gates per fin.

A static random access memory (SRAM) unit cell is an example of a complementary metal oxide semiconductor (CMOS) device. The SRAM unit cell includes two gates per fin on a p-channel metal oxide semiconductor field effect transistor (MOSFET) and two gates per fin on an n-channel MOSFET. The channel mobility in SRAM unit cells is significantly impacted by layout induced stress imposed on fins of the SRAM unit cells. The reduced channel mobility reduces the on-current of the finFET devices and reduces the speed of the finFET devices.

With respect to these and other considerations, the present disclosure is provided.

BRIEF SUMMARY

In one embodiment, a method of forming a semiconductor device may include providing a semiconductor device structure. The semiconductor device structure may include semiconductor fins pitched at a fin pitch on a substrate. The semiconductor device structure may include an isolation oxide layer on the substrate and between the semiconductor fins and a mask. The mask may be disposed over the isolation oxide layer and the mask may define at least one opening. The method may further comprise directing hot ions into the at least one opening, to implant hot ions in a volume of isolation oxide in the isolation oxide layer. The volume may be adjacent to at least one of the semiconductor fins.

In another embodiment, a semiconductor device structure may include semiconductor fins, disposed on a substrate, the semiconductor fins pitched at a fin pitch. The semiconductor device structure may also include an isolation oxide layer on the substrate and between the semiconductor fins. The isolation oxide layer may comprise at least a first volume of isolation oxide implanted with hot ions adjacent to each end of a first fin of the semiconductor fins, wherein the isolation oxide layer comprises a second volume of isolation oxide adjacent to a side of the first fin and adjacent to a side of the second fin of the semiconductor fins.

In a further embodiment, a method for forming static random access memory (SRAM) unit cell may comprise providing semiconductor fins on a substrate, the semiconductor fins pitched at a fin pitch. The method may comprise providing a mask, disposed over the semiconductor fins, the mask defining one or more openings. The method may comprise providing an isolation oxide disposed on the substrate and between the semiconductor fins. Furthermore, the method may comprise directing hot ions into the one or more openings to form a first volume of the isolation oxide, a second volume of the isolation oxide directly under the mask, wherein the first volume and the second volume are adjacent to at least one of the semiconductor fins.

DETAILED DESCRIPTION

Figure 1A:
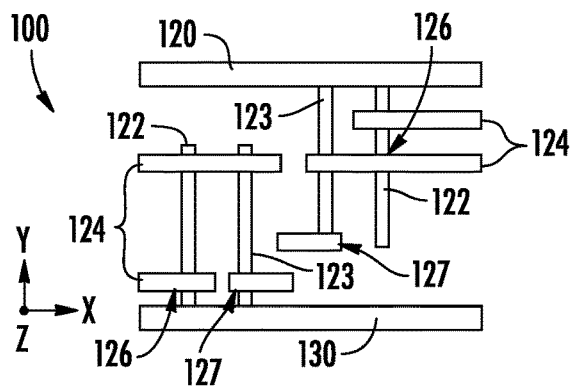
FIG. 1A shows a top view of a variant of a static random access memory (SRAM) cell unit, in accordance with embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Turning now to FIG. 1A there is shown a semiconductor device structure 100, according to embodiments of the disclosure. The semiconductor device structure 100 is shown in top view in FIG. 1A, as represented by the X-Y plane of the Cartesian coordinate system shown. The semiconductor device structure 100 depicts an embodiment of a static random access memory (SRAM) unit cell comprising fin type field effect transistor (finFET) logic with two or more logic finFETs. In the present embodiment, the semiconductor device structure 100 is an example of a complementary metal oxide semiconductor (CMOS) device. The semiconductor structure 100 includes two gates 124 per fin 123 on a p-channel metal oxide semiconductor field effect transistor (PFET) 127 and two gates 124 per fin 122 on an n-channel MOSFET (NFET) 126. Note that "fin" herein refers to a semiconductor fin.

The semiconductor device structure 100 comprises two fins 122 to form NFETs 126 with the gates 124 and two fins 123 to form PFETS 127 with the gates 124. The NFETs 126 may couple with a ground 130 and the PFETs 127 may couple with a power line such as a power rail. While not shown, pass gates may couple the SRAM cell unit with a word line 120 and a bit line to write data to or read data from the SRAM cell unit. In several embodiments, the NFETs 126 and the PFETs 127 may form as described below to increase channel mobility of the channels of the fins 122 and 123 by attenuating tensile stress associated with chemical vapor deposition (CVD) of a shallow trench isolation oxide (STI) such as silicon dioxide. In one embodiment, for instance, the CVD process may involve flowable CVD (FCVD).

Note that the semiconductor device structure 100 illustrates general structures included in the finFET logic portion of the SRAM cell unit including orientation of such structures but embodiments are not limited to a specific arrangement of such structures. Furthermore, the SRAM cell unit is one example of the semiconductor device structure 100 improved by embodiments described herein.

Figure 1B:
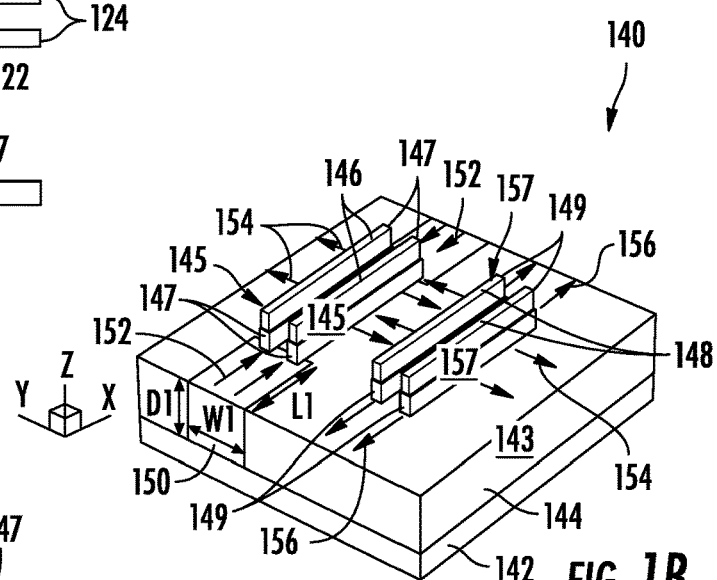
FIG. 1B depicts a three-dimensional view of a substrate with exposed semiconductor fins, the substrate having a layer of isolation oxide with volumes of the isolation oxide implanted with hot ions to add compressive stress along (parallel with) the semiconductor fins to form channels for p-channel metal oxide field effect semiconductor transistors (PFETs), according to embodiments of the disclosure.

FIG. 1B depicts a three-dimensional view of a semiconductor device structure 140 comprising a substrate 142 with exposed semiconductor fins 146 and 148. The substrate may comprise an isolation oxide layer 143 on top of the substrate 142 and the isolation oxide layer 143 may comprise volumes 150 of the isolation oxide, adjacent to the ends 147 of the fins 146, implanted with hot ions, and volumes 144 without hot ions implanted. The volumes 144 are adjacent to the sides of the fins 146 as well as adjacent to the sides 157 and ends 149 of the fins 148. The volumes 150 of the isolation oxide layer 143 implanted with hot ions may add compressive stress along (parallel with) the semiconductor fins 146 and 148 to form channels for p-channel metal oxide field effect semiconductor transistors (PFETs), according to embodiments of the disclosure.

The three-dimensional view illustrates the top surface of the semiconductor device structure 140 after fin reveal of the fins 146 for PFETs and the fins 148 for NFETs and prior to building the gates. The view of the upper surface of semiconductor device structure 140 is represented by the Y-Z-X Cartesian coordinate system shown.

The semiconductor device structure 140 depicts one embodiment of the orientation and configuration of the fins 122 and 123 illustrated in FIG. 1A. The semiconductor device structure 140 may include one or more semiconductor fins or pairs of fins such as the fins 146 and 148, disposed on a substrate 142, where the substrate 142 may represent any suitable substrate. As an example, the substrate 142 may include a monocrystalline semiconductor portion, such as silicon, where the semiconductor fins 146 and 148 are integrally formed from the monocrystalline semiconductor portion.

The semiconductor device structure 140 depicted herein may form above a semiconductor substrate 142 comprised of a semiconductor material, such as, for example, a bulk silicon substrate. The semiconductor device structure 140 may also form on SOI (semiconductor-on-insulator) substrates, wherein the substrate 142 would be the active layer of such an SOI substrate. Additionally, the substrate 142 may comprise any semiconductor material, e.g., silicon, silicon-germanium, germanium, a combination of III-V materials, etc. Thus, the terms "substrate," "semiconductor substrate" or "semiconducting substrate" should be understood to cover all semiconductor materials in whatever physical form.

The semiconductor device structure 140 may further include an isolation oxide layer 143 disposed on the upper surface of the substrate 142 including the upper surface of the substrate 142 between the semiconductor fins 146 and between the semiconductor fins 148. The isolation oxide layer 143 may represent any suitable isolation oxide such as a silicon dioxide. In some embodiments, the isolation oxide layer 143 may comprise a shallow trench isolation (STI) oxide formed via a chemical vapor deposition (CVD) such as flowable CVD (FCVD).

The process of densification and annealing associated with the CVD of the isolation oxide layer 143 may introduce tensile stress 154 and 156 on the fins 148. The tensile stress 156 is along the x-axis, along the fins 148, and, thus, parallel with the channels of the corresponding NFETs formed with the fins 148. The tensile stress 156 along the fins 148 pulls on the fins 148 with a force along the x-axis to elongate the fins 148. The tensile stress 154 is along the y-axis, perpendicular to the fins 146 and 148, and, thus, perpendicular to the channels of the corresponding PFETs and NFETs. In some embodiments, the tensile stress 154 can cause fin bending.

The process of densification and annealing associated with the CVD of the isolation oxide layer 143 may also limit compressive stress 152 on the fins 146 by imposition of tensile stress along the x-axis, along the fins 146, and, thus, parallel with the channels of the corresponding PFETs. The compressive stress 152 along the fins 146 pushes on the fins 146 with a force towards the fins 146.

The magnitudes of the compressive stress 152 and the tensile stress 154 and 156 may depend on the composition of the substrate 142. The impact of the compressive stress 152 and the tensile stress 154 and 156 depends in part on the configuration of the finFET as a PFET or an NFET and may depend in part on the number of gates per fin on the fins 146 and 148. For embodiments of an SRAM unit cell, such as the SRAM unit cell discussed in conjunction with FIG. 1A, the SRAM unit cell may have 2 gates per fin on the fins 146 and 148. In some embodiments, the stress resulting from the process of densification and annealing associated with the CVD of the isolation oxide layer 143 on the fins 146 and 148 may range between −1.0 gigapascals (GPa) compressive stress and +1.0 gigapascals tensile for a substrate 142 composed of silicon geranium (SiGe). In one embodiment, the compressive stress on the fins 146 for the PFETs may be more than −200 megapascals (MPa).

As shown in FIG. 1B, one feature of the semiconductor device structure 140 includes the volumes 150 of the isolation oxide layer 143 adjacent to both ends 147 of the fins 146 for the PFETs. The volumes 150 may include isolation oxide with concentrations of hot ion implantations such as a 1% hot helium (He) ion implantation or 5% hot helium ion implantation to alleviate the limitation on compressive stress caused by the process of densification and annealing associated with the CVD of the isolation oxide layer 143. For instance, we have found that implantation of hot ions of helium, nitrogen, carbon, silicon, and the like, can provide a compressive stress. Thus, ion implantation in the isolation oxide such as in the volumes 150 can increase, reduce, neutralize or counteract, or even reverse tensile stress on the fins 146, depending on the element implanted, the atomic concentration of the implanted ions, the temperature of the ions, and possibly other factors such as the volume 150 of the isolation oxide implanted with the ions.

The energy of the hot ion implantation affects the depth of ion implantation. Ion implanters vary in design but can be characterized by the ranges of energy of implantation such as high energy, medium energy, and low energy. The high energy implanters may implant a high dose of ions at a high depth. Medium energy ion implanters may implant a medium dose of ions at a medium depth and low energy implanters may implant a low dose of ions at a shallow depth. The selection of the implanter is implementation specific and may depend on a targeted tensile stress and compressive stress for the isolation oxide, the element implanted, the atomic concentration, and the volume 150 of the isolation oxide layer 143 for ion implantation.

For isolation oxides 143 with an average thickness or depth of 2000 angstroms, the energy of the hot ion implantation may implant the hot ions to a depth of up to, e.g., 2000 angstroms in the isolation oxide layer 143 in the volumes 150. In some embodiments, the maximum depth for the hot ion implantation may be less than the average thickness of the isolation oxide layer 143 to avoid implantation of the hot ions in the substrate 142 and/or for other reasons. The size of the volumes 150 are implementation specific but provide a compressive stress 156 on the fins 146 to increase the compressive force parallel to the fins 146. In one embodiment, the width W1, of the volume 150 is a fin pitch plus a fin width. In other embodiments, the width, W1, may be greater than a fin pitch plus a fin width such as up to two fin pitches or up to three fin pitches. Furthermore, the length, L1, of the volumes 150 may vary based on implementation.

Figure 1C:
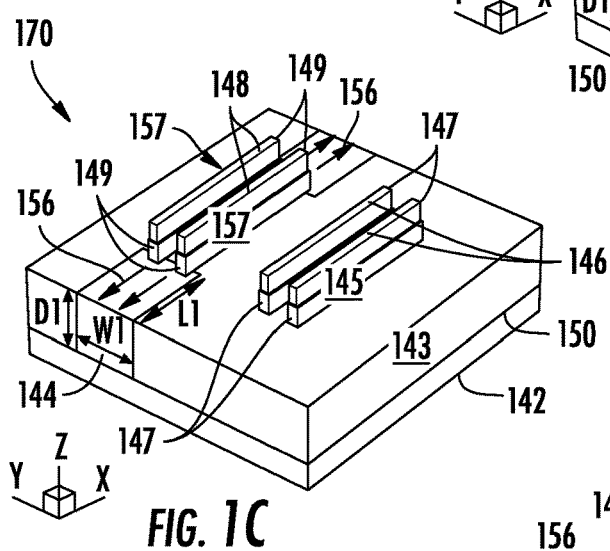
FIG. 1C depicts a three-dimensional view of a substrate with exposed semiconductor fins, the substrate having a layer of isolation oxide with volumes of the isolation oxide implanted with hot ions to attenuate tensile stress generally and to leave tensile stress along (parallel with) the semiconductor fins to form channels for n-channel metal oxide field effect semiconductor transistors (NFETs), according to embodiments of the disclosure.

FIG. 1C depicts a three-dimensional view of a semiconductor device structure 170 having a substrate 142 with exposed semiconductor fins 146 and 148. The substrate 142 includes an isolation oxide layer 143 with a volume 150 of the isolation oxide implanted with hot ions, advantageously, to attenuate or neutralize the tensile stress perpendicular to the fins 146 and 148 and parallel with the fins 146. In the present embodiment, the volume 150 is adjacent to the sides 157 of fins 148 and adjacent to the sides 145 and ends 147 of the fins 146.

The isolation oxide layer 143 may also advantageously avoid implantation of hot ions in a volume 144 of the isolation oxide to increase channel mobility in the channels formed with the fins 148. The volume 144 is adjacent to the ends 147 of the fins 148. The three-dimensional view illustrates the top surface of the semiconductor device structure 170 after fin reveal of the fins 146 for PFETs and the fins 148 for NFETs, and prior to building the gates. The view of the upper surface of semiconductor device structure 170 is represented by the Y-Z-X Cartesian coordinate system shown.

The semiconductor device structure 170 depicts one embodiment of the orientation and configuration of the fins 122 and 123 illustrated in FIG. 1A. The semiconductor device structure 170 may include one or more semiconductor fins or pairs of fins such as the fins 146 and 148. The fins 146 and 146 may be disposed on a substrate 142, where the substrate 142 may represent any suitable substrate such as a bulk silicon substrate or SOI substrate, and may be comprised of any semiconductor material, e.g., silicon, silicon-germanium, germanium, a combination of III-V materials, etc. The semiconductor device structure 170 may further include an isolation oxide layer 143 disposed on the upper surface of the substrate 142 and between the fins 146 and 148. The isolation oxide layer 143 may represent any suitable isolation oxide.

The process of densification and annealing associated with the CVD of the isolation oxide layer 143 may introduce tensile stress 156 on the fins 148. The tensile stress 156 is along the x-axis, along the fins 148, and, thus, parallel with the channels of the corresponding NFETs.

The semiconductor device structure 170 is similar to the semiconductor device structure 140 in FIG. 1B but, as shown in FIG. 1C, one feature of the semiconductor device structure 170 is the hot ion implantation in a volume 150 of the isolation oxide layer 143 and exclusion of the hot ion implantation in the volumes 144 of the isolation oxide layer 143 adjacent to both ends 149 of the fins 148 along the x-axis. For instance, hot ion implantation may implant ions with isolation oxide temperatures maintained between, e.g., 300 to 600 degrees Celsius, and with energies of, e.g., 10 to 30 kiloelectron volts (keV). In some embodiments, the dose of ions may be 1E15 to 1E17 ions/cm$^2$ (ions per centimeter squared) where 1E15 is scientific notation for 1 times 10 to the power of 15 and 1E17 is scientific notation for 1 times 10 to the power of 17.

The volumes 144 of the isolation oxide layer 143 are not implanted with the hot ions may have a maximum depth, D1, for the hot ion implantation of less than the average thickness of the isolation oxide layer 143 to avoid implantation of the hot ions in the substrate 142. The size of the volumes 144 are implementation specific but provide a tensile stress 156 along the fins 148 or parallel to the fins 148. In one embodiment, the width W1, of the volume 144 is a fin pitch plus a fin width. In other embodiments, the width, W1, may be greater than a fin pitch plus a fin width such as up to two fin pitches or up to three fin pitches. Furthermore, the length, L1, of the volumes 144 may vary based on implementation. In other embodiments, if the volume 144 is adjacent to a single fin rather than a pair of fins, the width, W1, of the volume 144 may be a fin pitch or between a fin pitch and a fin width.

In the present embodiment, while the tensile stress from the CVD of the isolation oxide layer 143 about the fins 146 reduces negative effects such as fin bending, the channel mobility of the fins 146 for the PFETs may not benefit from a compressive stress.

Figure 1D:
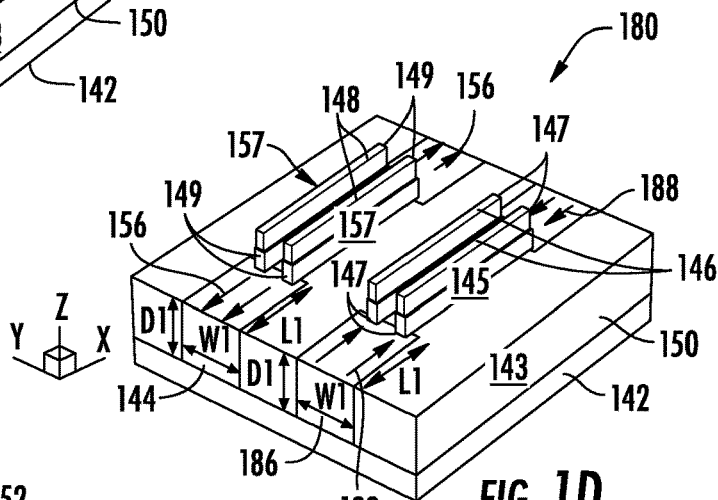
FIG. 1D depicts a three-dimensional view of a substrate with exposed semiconductor fins, the substrate having a layer of isolation oxide with volumes of the isolation oxide implanted with hot ions to attenuate tensile stress generally, to add tensile stress along (parallel to) the semiconductor fins to form channels NFETs, and to add compressive stress along (parallel with) the semiconductor fins to form channels PFETs, according to embodiments of the disclosure.

FIG. 1D depicts a three-dimensional view of a semiconductor device structure 180 similar to the semiconductor device structure 140 in FIG. 1B having a substrate 142 with exposed semiconductor fins 146 and 148. As shown in FIG. 1D, one feature of the semiconductor device structure 170 is inclusion, on the substrate 142, of an isolation oxide layer 143 with volumes 150 of the isolation oxide implanted with hot ions to attenuate or neutralize the tensile stress perpendicular to the fins 146 and 148. The volumes 150 is adjacent to the sides 145 and 157 of the fins 146 and 148, respectively.

The isolation oxide layer 143 also includes volumes 186 of the isolation oxide implanted with hot ions to add the compressive stress 188 parallel to the fins 146, advantageously, to improve channel mobility of the channels formed with the fins 146. The volumes 186 are adjacent to the ends 147 of the fins 146. Furthermore, the volumes 144 of isolation oxide layer 143 not implanted with hot ions may, advantageously, apply tensile stress along the fins 148 for the NFETs, along the x-axis, to increase channel mobility of the channels formed with the fins 148. The volumes 144 are adjacent to the ends of fins 148.

The three-dimensional view illustrates the top surface of the semiconductor device structure 180 after fin reveal of the fins 146 for PFET devices and the fins 148 for NFET devices, and prior to building the gates. The view of the upper surface of semiconductor device structure 180 is represented by the Y-Z-X Cartesian coordinate system shown.

The volumes 144 of the isolation oxide layer 143 are not implanted with the hot ions and may have dimensions of W1, L1, and D1 as discussed in conjunction with the semiconductor device structure 140. In some embodiments, the depth, D1, may be based on the thickness of the isolation oxide layer 143 and/or a depth based on other considerations. The width, W1, of the volume 144 may be a fin pitch plus a fin width. In other embodiments, the width, W1, may be greater than a fin pitch plus a fin width such as up to two fin pitches or up to three fin pitches. In still other embodiments, the width, W1, may be between a fin pitch and a fin width. Furthermore, the length, L1, of the volumes 144 may vary based on implementation.

Similarly, the volumes 186 of the isolation oxide layer 143 are implanted with the hot ions and may have dimensions of W1, L1, and D1 as discussed in conjunction with the semiconductor device structure 140. In some embodiments, one or more of the W1, L1, and D1 dimensions may differ from the dimensions for the volumes 144. In other embodiments, the W1, L1, and D1 dimensions may be the same as the dimensions for the volumes 144.

In some embodiments, the maximum depth, D1, for the hot ion implantation may be less than the average thickness of the isolation oxide layer 143 to avoid implantation of the hot ions in the substrate 142. The size of the volumes 186 are implementation specific but provide a compressive stress 188 along the fins 146. In one embodiment, the width W1, of the volume 186 is a fin pitch plus a fin width. In other embodiments, the width, W1, may be greater than a fin pitch plus a fin width such as up to two fin pitches or up to three fin pitches. Furthermore, the length, L1, of the volumes 186 may vary based on implementation. In other embodiments, if the volume 186 is adjacent to a single fin rather than a pair of fins, the width, W1, of the volume 186 may be a fin pitch or between a fin pitch and a fin width.

Figure 1E:
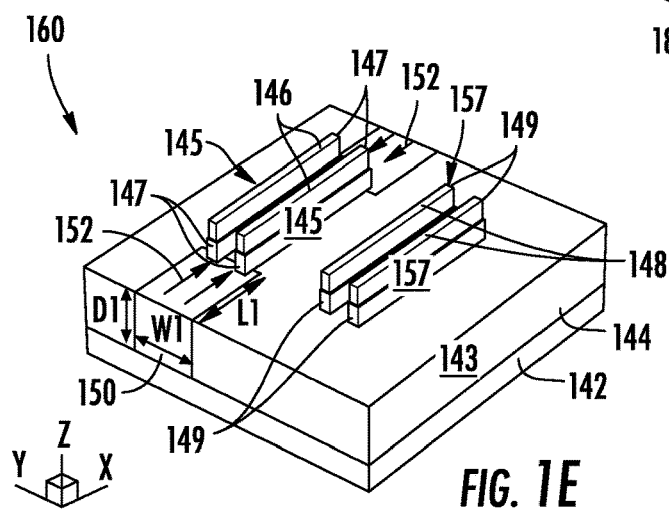
FIG. 1E depicts a three-dimensional view of a substrate with exposed semiconductor fins, the substrate having a layer of isolation oxide with volumes of the isolation oxide implanted with hot ions to attenuate tensile stress generally, masked to relieve tensile stress on the fins generally, and implanted with hot ions to add compressive stress along (parallel with) the semiconductor fins to form channels PFETs, according to embodiments of the disclosure.

FIG. 1E depicts a three-dimensional view of a semiconductor device structure 160 similar to the semiconductor device structure 140 in FIG. 1B. The semiconductor device structure 160 may comprise a substrate 142 with exposed semiconductor fins 146 and 148. As shown in FIG. 1E, one feature of the semiconductor device structure 160 is inclusion, on the substrate 142, of an isolation oxide layer 143 with a volume 150 of the isolation oxide implanted with hot ions to add the compressive stress 152 parallel to the fins 146. Adding the compressive stress 152 parallel to the fins 146 may, advantageously, improve channel mobility of the channels formed with the fins 146. Furthermore, the fins 146 are interconnected with a hard mask and the fins 148 are interconnected with a hard mask during the densification and annealing of the CVD of isolation oxide, advantageously, to reduce negative effects of tensile stress perpendicular to the fins 146 and the fins 148 along the y-axis such as fin bending.

The three-dimensional view illustrates the top surface of the semiconductor device structure 160 after fin reveal of the fins 146 for PFET devices and the fins 148 for NFET devices and prior to building the gates. The view of the upper surface of semiconductor device structure 180 is represented by the Y-Z-X Cartesian coordinate system shown.

The volumes 144 of the isolation oxide layer 143 are not implanted with the hot ions, leaving the tensile stress along (parallel with) the fins 148 to form channels for NFETs, according to embodiments of the disclosure. The volumes 150 of the isolation oxide layer 143 are implanted with the hot ions and may have dimensions of W1, L1, and D1 as discussed in conjunction with the semiconductor device 140.

Figure 2A:
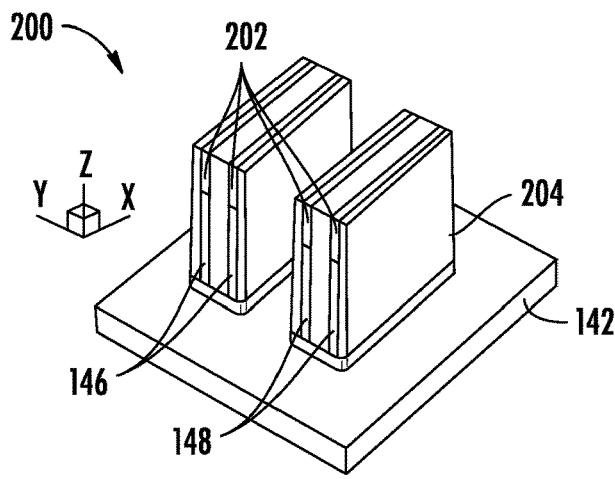
FIG. 2A-F depict three-dimensional views of a semiconductor device at different stages of fabrication to produce the semiconductor device in FIG. 1B, according to embodiments of the disclosure.

FIGS. 2A-F depict three-dimensional views of a semiconductor device at different stages of fabrication to produce the semiconductor device 140 in FIG. 1B, according to embodiments of the disclosure. FIG. 2A depicts a three-dimensional view of a semiconductor device structure 200 at a stage of fabrication after fin patterning, CVD of an isolation oxide 204, and fin cutting. The semiconductor device structure 200 comprises a substrate 142 with fins 146 and 148. A hard mask 202 is on top of the fins 146 and 148 and an isolation oxide 204 is on the sides 145 and 157 of the fins 146 and 148. Note that the sides 145 and 157 run the length of the fins 146 and 148, respectively, in parallel with the x-axis, between the ends 147 and 149 of the fins 146 and 148, respectively.

Figure 2B:
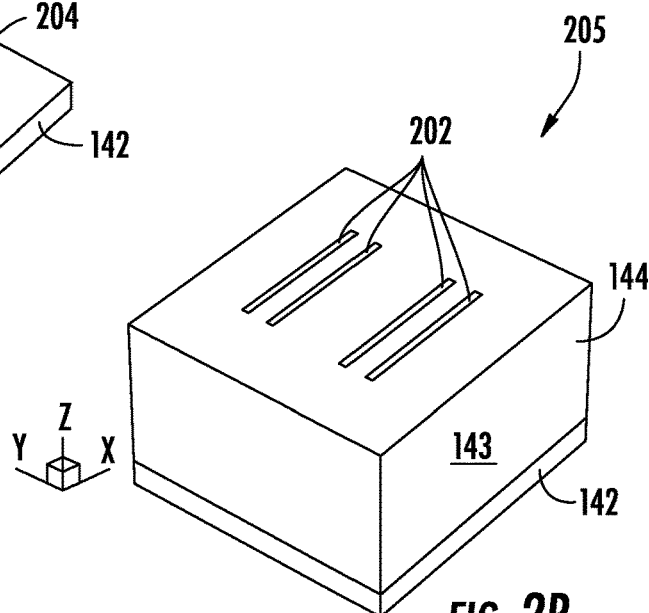
Figure 2C:
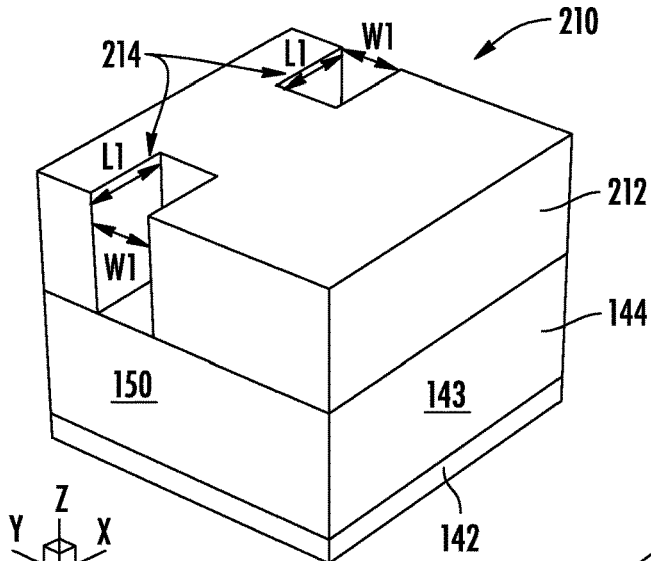

FIG. 2B illustrates a subsequent stage of fabrication to produce the semiconductor device 140 in FIG. 1B. The semiconductor device structure 205 comprises an isolation oxide layer 143 with a volume 144 from the substrate 142 to the hard masks 202 on top of the fins 146 and 148. In FIG. 2C, a mask 212 forms on top of the semiconductor device structure 210 above or on top of the isolation oxide layer 143. In some embodiments, the mask 212 may comprise a lithographic mask such as a negative or positive photoresist or a hard mask patterned to include openings or areas 214. The areas 214 may be defined by the length, L1, and the width, W1, by, e.g., exposing a positive photoresist or negative photoresist to ultraviolet light and removing the more soluble material with a developer. The length, L1, and the width, W1, are defined as discussed in conjunction with FIG. 1B. The areas 214 define volumes 150 of the isolation oxide layer 143 to receive hot ions via hot ion implantation through the mask 212.

Figure 2D:
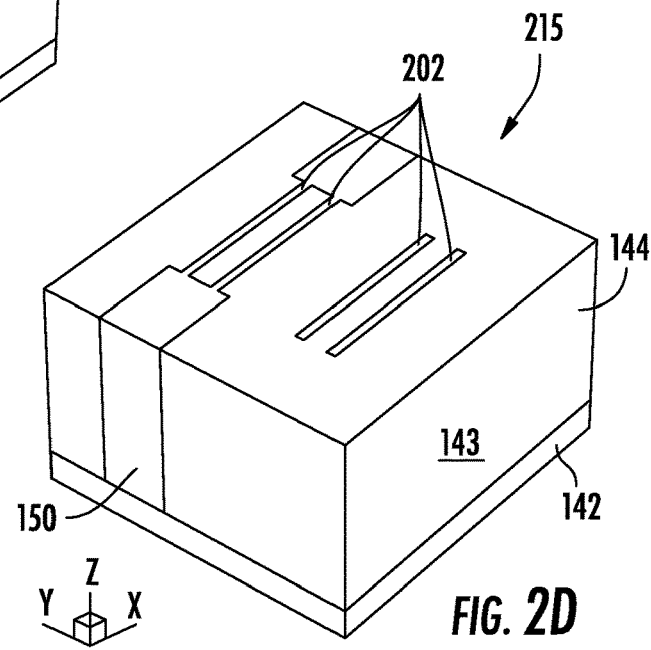

FIG. 2D illustrates a subsequent stage of fabrication to produce the semiconductor device 140 in FIG. 1B. In the semiconductor device structure 215, the volumes 150 include the hot ions such as hot helium ions implanted through the mask 212 and the mask 212 has been removed from the top of the isolation oxide layer 143. The volumes 150 may provide a compressive stress on the fins 146 for forming channels of PFETs. The volume 144 of the isolation oxide layer 143 remains unaffected by the hot ion implantation so the tensile stress from the CVD of the isolation oxide remains.

Figure 2E:
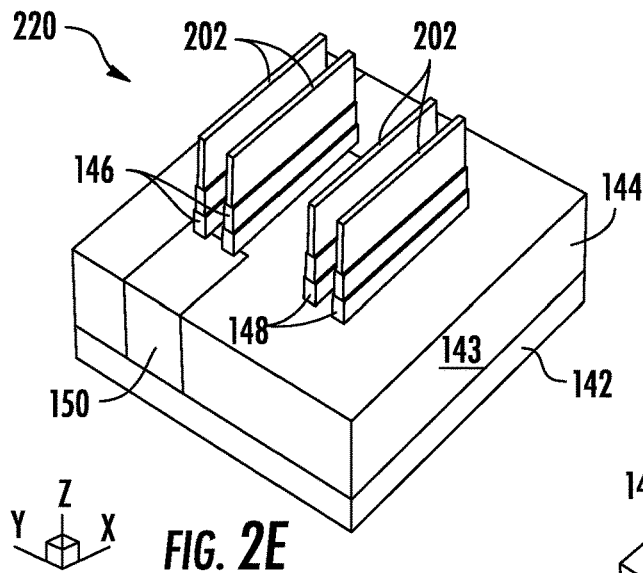
Figure 2F:
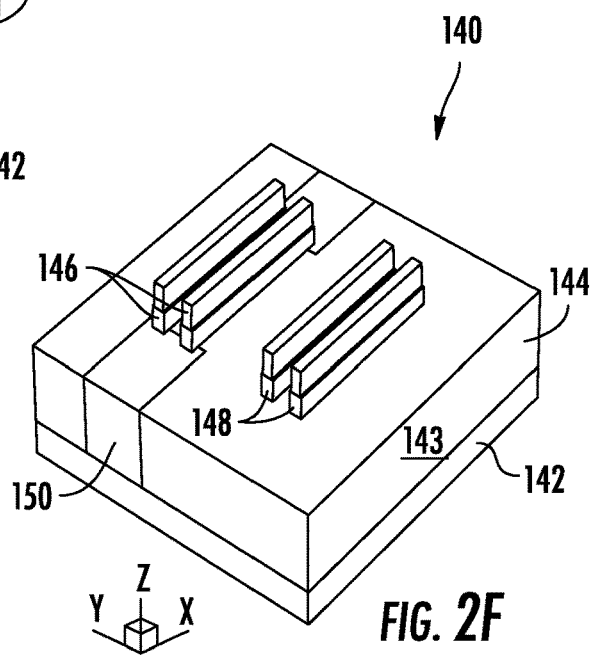

FIG. 2E illustrates a fin reveal stage with the semiconductor device structure 220. A portion of the isolation oxide layer 143 is removed or recessed to reveal the fins 146 and 148 and the hard masks 202 on top the fins 146 and 148. Then, in FIG. 2F, hard mask 202 removal from the tops of the fins 146 and 148 reveals the semiconductor device structure 140 illustrated in FIG. 1B.

Figure 3A:
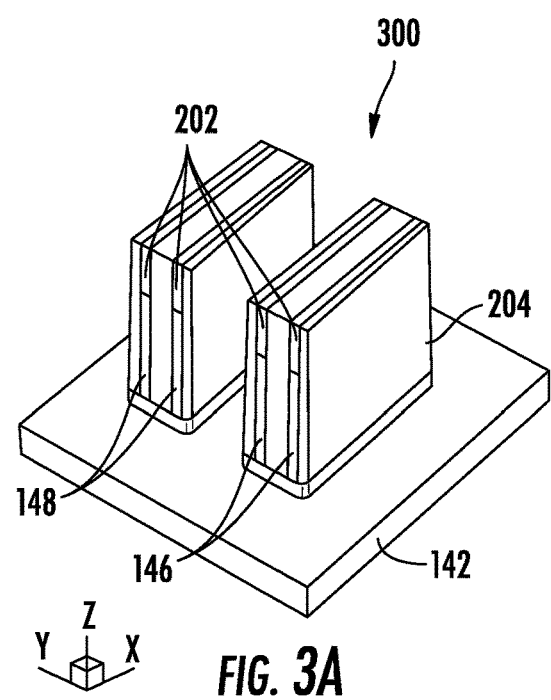
FIGS. 3A-F depict three-dimensional views of a semiconductor device at different stages of fabrication to produce the semiconductor device in FIG. 1C, according to embodiments of the disclosure.

FIGS. 3A-F depict three-dimensional views of a semiconductor device at different stages of fabrication to produce the semiconductor device structure 170 in FIG. 1C, according to embodiments of the disclosure. FIG. 3A depicts a three-dimensional view of a semiconductor device structure 300 at a stage of fabrication after fin patterning, CVD of an isolation oxide 204, and fin cutting. The semiconductor device structure 300 comprises a substrate 142 with fins 146 and 148. A hard mask 202 is on top the fins and an isolation oxide 204 is on the sides 145 and 157 of the fins 146 and 148, respectively.

Figure 3B:
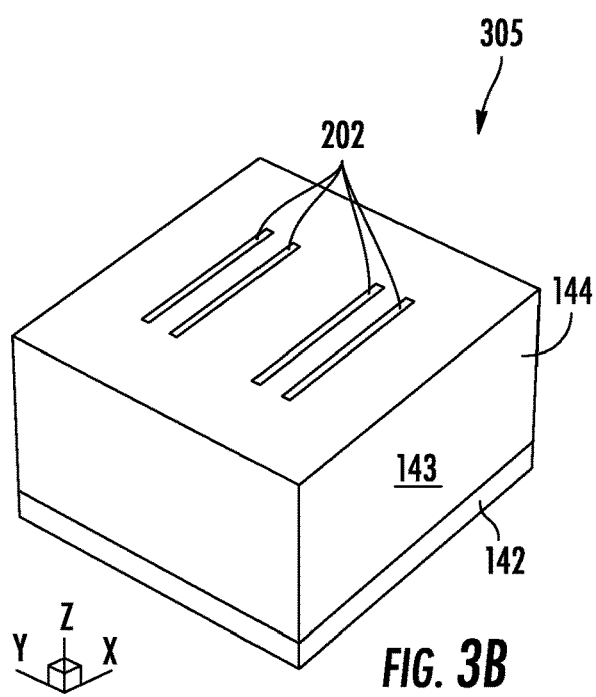
Figure 3C:
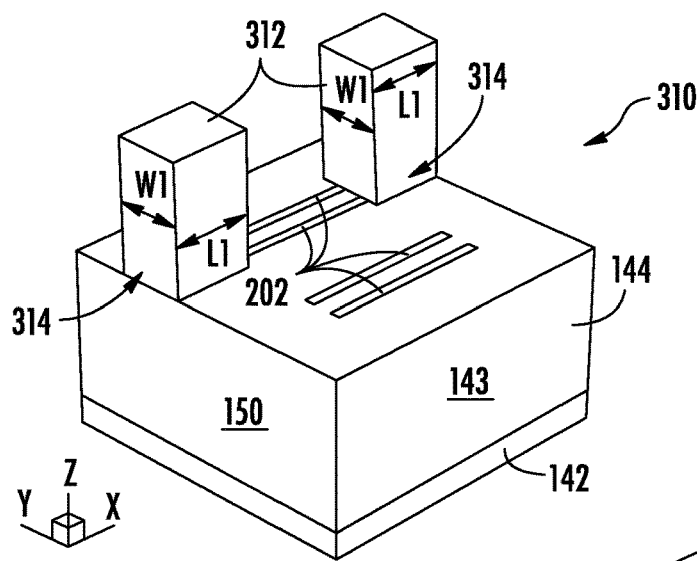

FIG. 3B illustrates a subsequent stage of fabrication to produce the semiconductor device structure 170 in FIG. 1C. The semiconductor device structure 305 comprises an isolation oxide layer 143 with a volume 144 from the substrate 142 to the hard masks 202 on top of the fins 146 and 148. In FIG. 3C, the mask 312 forms on top of the semiconductor device structure 310 above the isolation oxide layer 143. In some embodiments, the mask 312 may comprise lithographic masks such as negative or positive photoresist or hard masks patterned to cover the areas 314 of the isolation oxide layer 143 under the mask 312. The areas 314 may be defined by the length, L1, and the width, W1, of the mask 312. Furthermore, the mask 312 may not cover areas or openings such as the portion of the isolation oxide layer 143 remaining uncovered after formation of the mask 312. The length, L1, and the width, W1, are defined as discussed in conjunction with FIG. 1C. The areas 314 cover volumes of the isolation oxide layer 143 to prevent hot ion implantation and also define volumes 150 of the isolation oxide layer 143 to receive hot ions via hot ion implantation through openings the mask 312.

Figure 3D:
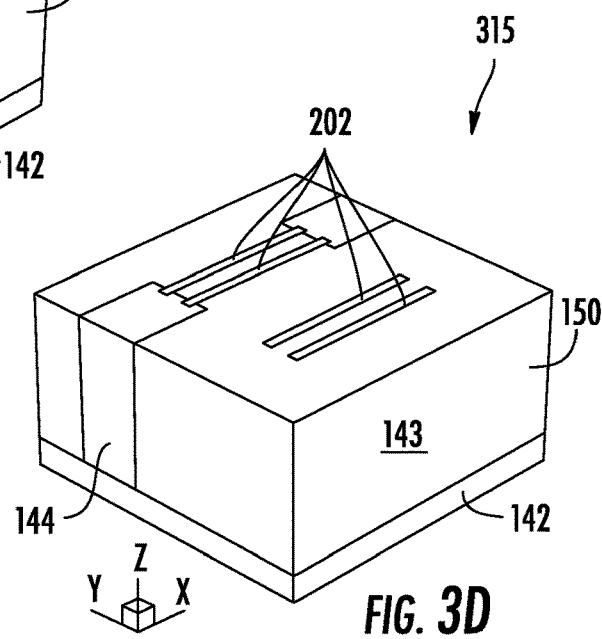

FIG. 3D illustrates a subsequent stage of fabrication to produce the semiconductor device structure 170 in FIG. 1C. For the semiconductor device structure 315, the volumes 150 include the hot ions such as hot helium ions implemented around the masks 312 and the masks 312 are removed from the top of the isolation oxide layer 143. The hot ion implantation in the volumes 150 may relieve or neutralize tensile stress on the fins 146 and 148 except for the tensile stress resulting from the from the CVD of the isolation oxide 144 under the masks 312. The volume 144 of the isolation oxide layer 143 remains unaffected by the hot ion implantation so the tensile stress from the CVD of the isolation oxide remains parallel with the fins 148 to form channels for the NFETs.

Figure 3E:
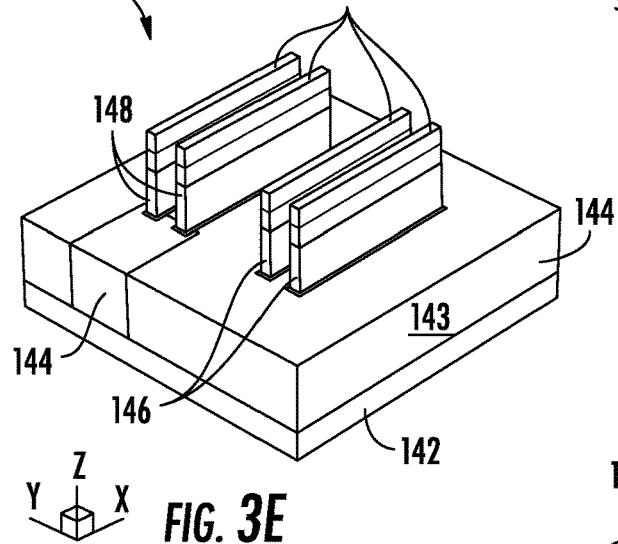
Figure 3F:
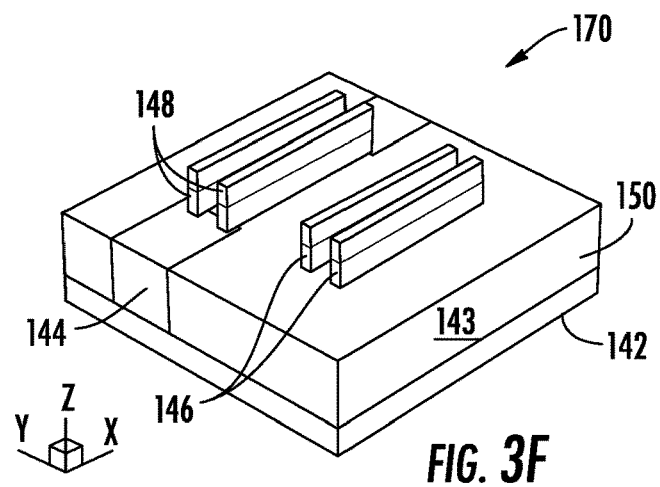

FIG. 3E illustrates a fin reveal stage with the semiconductor device structure 320. A portion of the isolation oxide layer 143 is removed or recessed to reveal the fins 146 and 148 and the hard masks 202 on top the fins 146 and 148. Then, in FIG. 3F, the hard masks 202 are removed from the tops of the fins 146 and 148 to reveal the semiconductor device structure 170 illustrated in FIG. 1C.

Figure 4A:
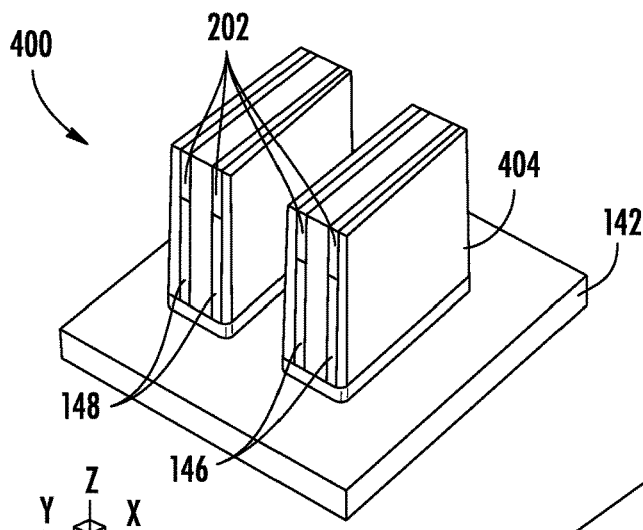
FIGS. 4A-H depict three-dimensional views of a semiconductor device at different stages of fabrication to produce the semiconductor device in FIG. 1D, according to embodiments of the disclosure.

FIGS. 4A-H depict three-dimensional views of a semiconductor device at different stages of fabrication to produce the semiconductor device structure 180 in FIG. 1D, according to embodiments of the disclosure. FIG. 4A depicts a three-dimensional view of a semiconductor device structure 400 at a stage of fabrication after fin patterning, CVD of an isolation oxide 404, and fin cutting. The semiconductor device structure 300 comprises a substrate 142 with fins 146 and 148. The fins 146 and 148 include a hard mask 202 on top the fins and an isolation oxide 204 on the sides 145 and 157 of the fins 146 and 148, respectively.

Figure 4B:
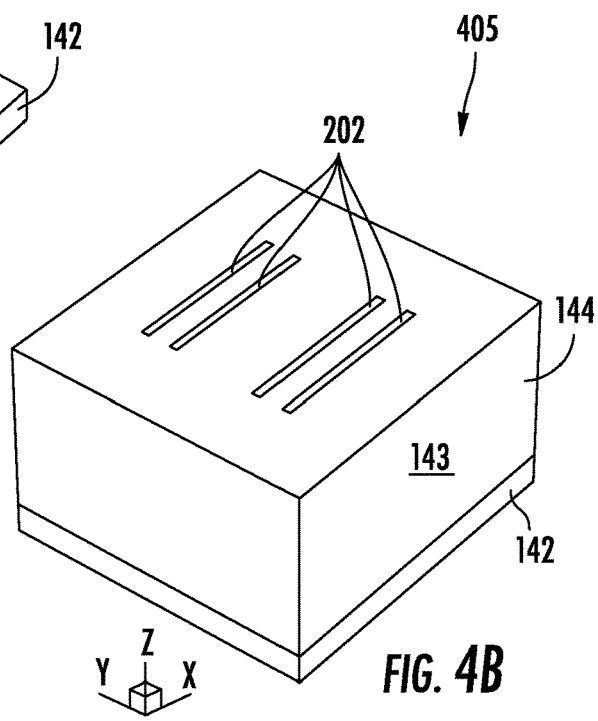
Figure 4C:
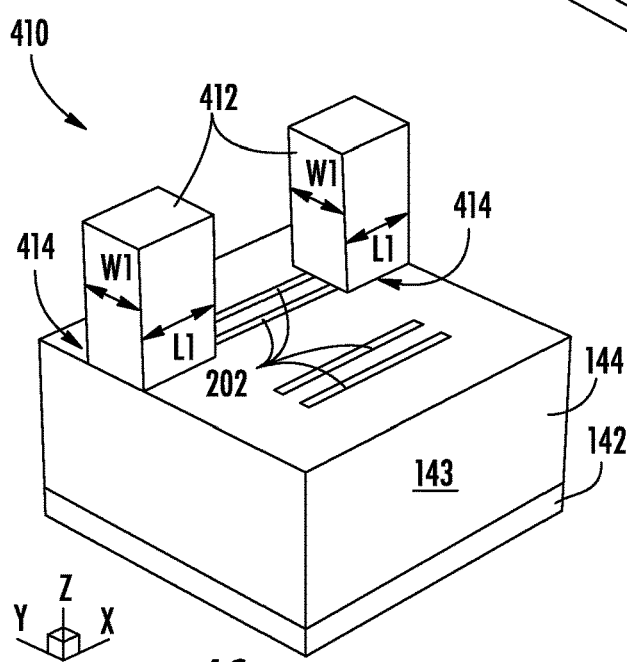

FIG. 4B illustrates a subsequent stage of fabrication to produce the semiconductor device structure 180 in FIG. 1D. The semiconductor device structure 405 comprises an isolation oxide layer 143 with a volume 144 on top of the substrate 142 and up to the hard masks 202 on top of the fins 146 and 148. In FIG. 4C, mask 412 form on top of the semiconductor device structure 410 above the isolation oxide layer 143. In some embodiments, the mask 412 may comprise lithographic masks such as negative or positive photoresist or hard masks patterned to cover the areas 414 or volumes of the isolation oxide layer 143 directly under the mask 412 defined by the length, L1, and the width, W1. The length, L1, and the width, W1, are defined as discussed in conjunction with FIG. 1C. The mask 312 also defines areas or openings to expose volumes in the isolation oxide layer 143. The exposed volumes in the isolation oxide layer 143 can receive hot ions from an ion implanter.

Figure 4D:
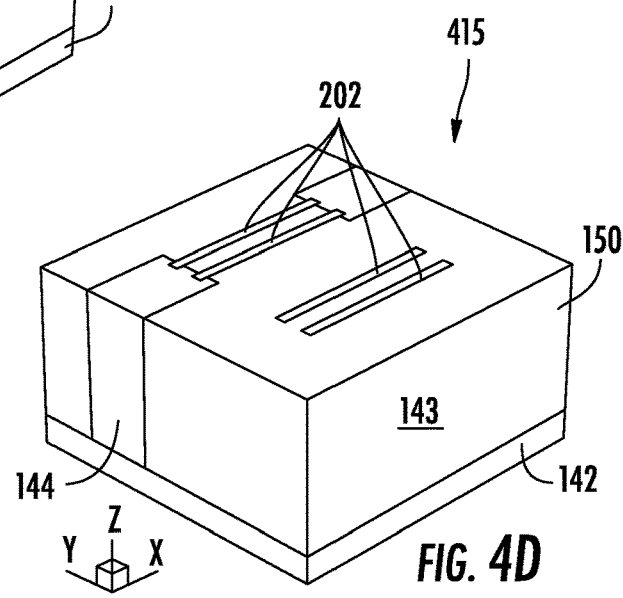

FIG. 4D illustrates a subsequent stage of fabrication to produce the semiconductor device structure 180 in FIG. 1D. For the semiconductor device structure 415, the volumes 150 include the hot ions such as hot helium ions implemented around the masks 412. After implanting the hot ions, the masks 412 are removed from the top of the isolation oxide layer 143. The hot ion implantation in the volumes 150 may relieve or neutralize tensile stress on the fins 146 and 148 except for the tensile stress resulting from the from the CVD of the isolation oxide 144 under the masks 412. The volume 144 of the isolation oxide layer 143 remains unaffected by the hot ion implantation so the tensile stress from the CVD of the isolation oxide remains parallel with the fins 146 to form channels for the NFETs.

Figure 4E:
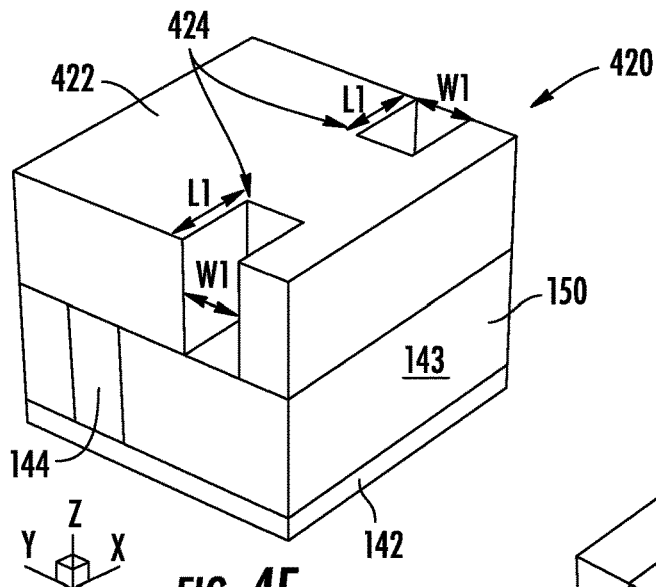

In FIG. 4E, a mask 422 forms on top of the semiconductor device structure 415 above a volume of the isolation oxide layer 143 to form the semiconductor device structure 420. In some embodiments, the mask 422 may comprise a lithographic mask such as a negative or positive photoresist or a hard mask patterned to exclude the areas 424 or include openings defined by the areas 424 by the length, L1, and the width, W1. The length, L1, and the width, W1, are defined as discussed in conjunction with FIG. 1B. The areas 424 are disposed over or define volumes 186 in the isolation oxide layer 143 to receive hot ions via hot ion implantation through the mask 422.

Figure 4F:
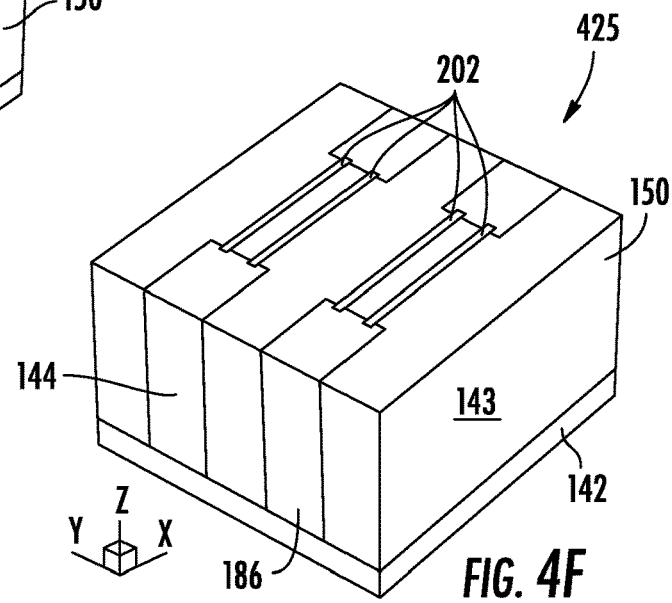

FIG. 4F illustrates a subsequent stage of fabrication to produce the semiconductor device structure 180 in FIG. 1D. For the semiconductor device structure 425, the volumes 186 include the hot ions such as hot helium ions implemented through the mask 422 and the mask 422 is removed from the top of the isolation oxide layer 143. The hot ion implantation in the volumes 186 may add compressive stress on the fins 146 along the fins 146 and parallel to the channels to form in with the fins 146 for PFETs. The hot ion implantation in the volumes 150 may relieve or neutralize tensile stress on the fins 146 and 148 except for the tensile stress resulting from the from the CVD of the isolation oxide 144 under the masks 412. The volume 144 of the isolation oxide layer 143 remains unaffected by the hot ion implantation so the tensile stress from the CVD of the isolation oxide remains parallel with the fins 148 to form channels for the NFETs.

Figure 4G:
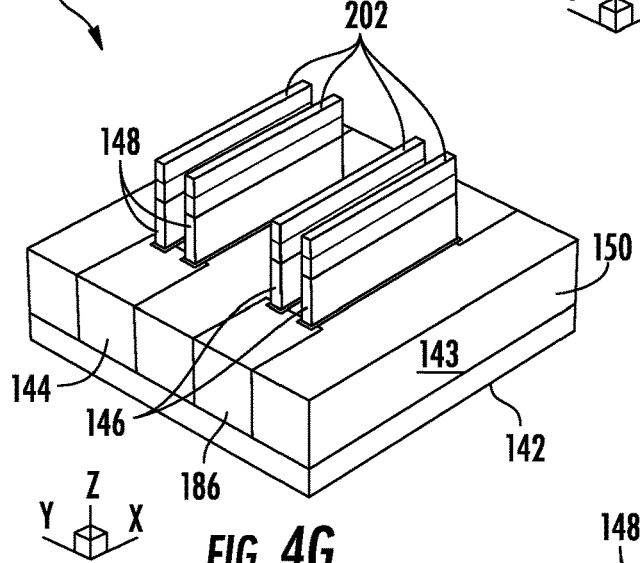
Figure 4H:
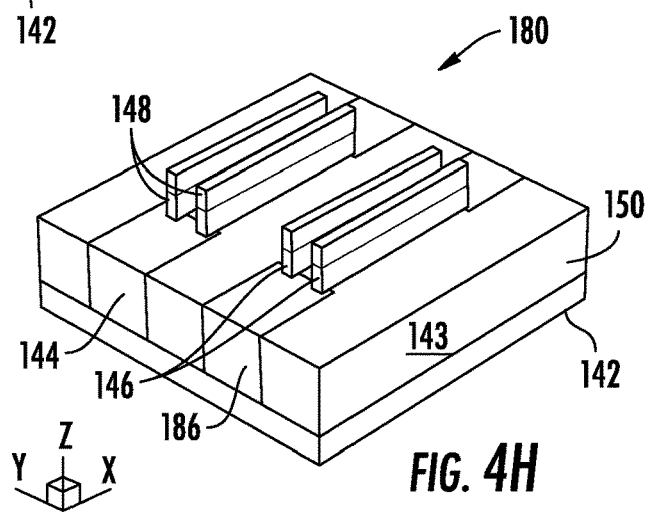

FIG. 4G illustrates a fin reveal stage with the semiconductor device structure 430. A portion of the isolation oxide layer 143 is removed or recessed to reveal the fins 146 and 148 and the hard masks 202 on top of the fins 146 and 148. Thereafter, in FIG. 4H, the hard masks 202 are removed from the tops of the fins 146 and 148 to reveal the semiconductor device structure 180 illustrated in FIG. 1D.

Figure 5A:
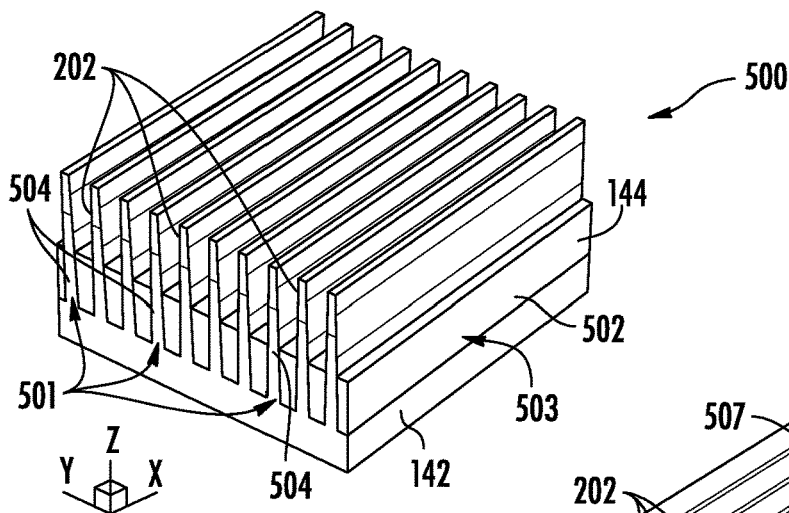
FIGS. 5A-H depict three-dimensional views of a semiconductor device at different stages of fabrication to produce the semiconductor device in FIG. 1E, according to embodiments of the disclosure.

FIGS. 5A-H depict three-dimensional views of a semiconductor device at different stages of fabrication to produce the semiconductor device structure 160 in FIG. 1E, according to embodiments of the disclosure. FIG. 5A depicts a three-dimensional view of a semiconductor device structure 500 at a stage of fabrication after fin patterning, CVD of an isolation oxide 502, and fin reveal. The semiconductor device structure 500 comprises a substrate 142 with fins 504. The fins 504 include a hard mask 202 on top of the fins 504 and an isolation oxide 502 partially recessed on the sides 503 of the fins 504. Note that the sides 503 of the fins 504 run along the length of the fins 504 along the x-axis between the ends 501 of the fins 504.

Figure 5B:
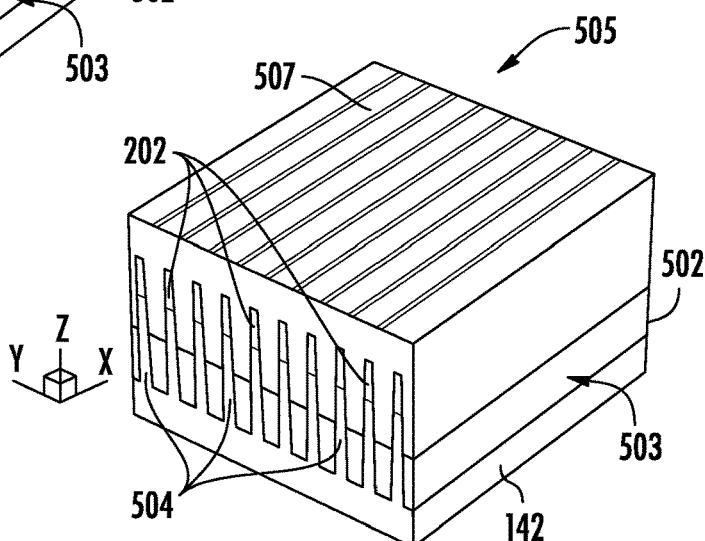

FIG. 5B illustrates a subsequent stage of fabrication to produce the semiconductor device structure 160 in FIG. 1E. The semiconductor device structure 505 includes a hard mask layer 507 in a volume comprising the partial recess between the fins 504 and covering the hard mask 202 on top of the fins 504.

Figure 5C:
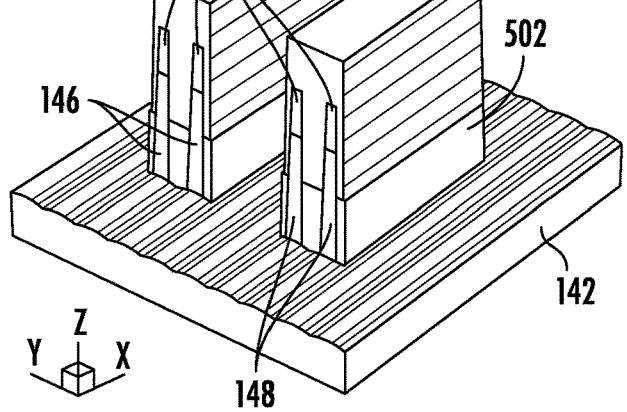

FIG. 5C illustrates a fin cut stage of fabrication to produce the semiconductor device structure 160 in FIG. 1E. In the fin cut stage, the fins 504 are removed by, e.g., etching, to reveal the fins 146 and 148. The semiconductor device structure 510 may comprise the fins 146 and 148 with a hard mask 202 on top the fins 146 and 148, an isolation oxide 502 partially recessed on the sides 145 and 157 of the fins 146 and 148, respectively, and a hard mask 507 covering the remainder of the sides of the fins 146 and 148. In the present embodiment, the hard mask layer 507 may also interconnect the fins 146 and may interconnect the fins 148, advantageously, to add structural stability to the fins 146 and 148 and to reduce or relieve tensile stress from prior and/or subsequent CVD of an isolation oxide layer 143.

Figure 5D:
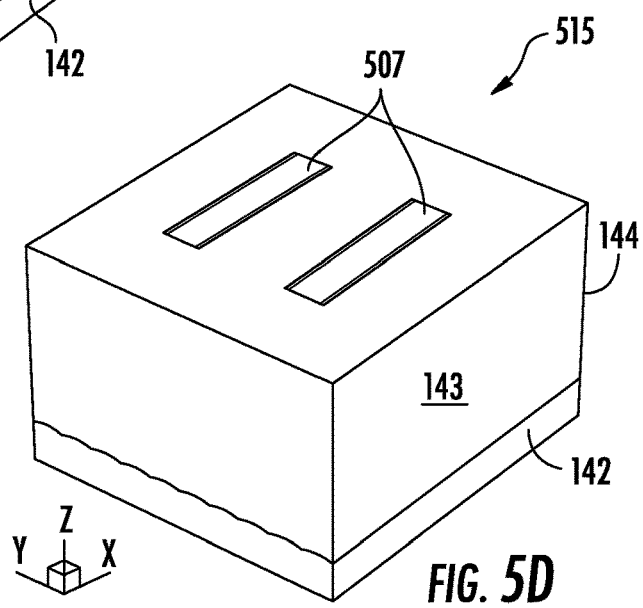
Figure 5E:
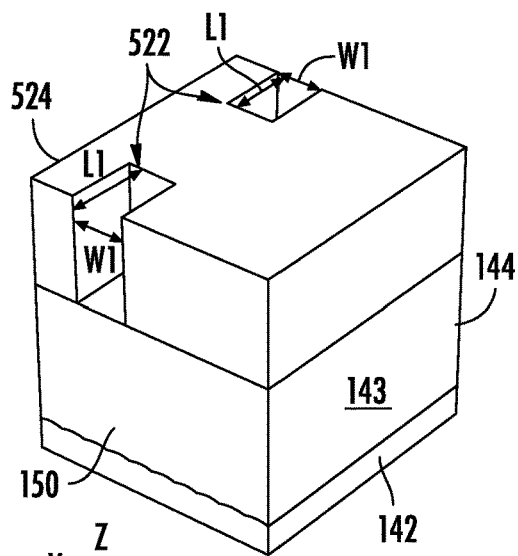

FIG. 5D depicts the semiconductor device structure 510 from FIG. 5C after CVD of isolation oxide. The semiconductor device structure 515 comprises a substrate 142 with an isolation oxide layer 143 with a volume 144 from the substrate to the top of the hard mask 507 on the fins 146 and 148. In FIG. 5E, a mask 524 forms on top of the semiconductor device structure 515 above the isolation oxide layer 143 to form the semiconductor device 520. In some embodiments, the mask 524 may comprise a lithographic mask such as negative or positive photoresist or hard mask patterned with the areas 522 or openings directly over or disposed over volumes 150 of the isolation oxide layer 143. The volumes 150 are directly under the portions of the mask 524 defined by the length, L1, and the width, W1. The length, L1, and the width, W1, are defined as discussed in conjunction with FIG. 1C. The volumes 150 may receive hot ions via hot ion implantation through the areas 522 of each of the portions of the mask 524.

Figure 5F:
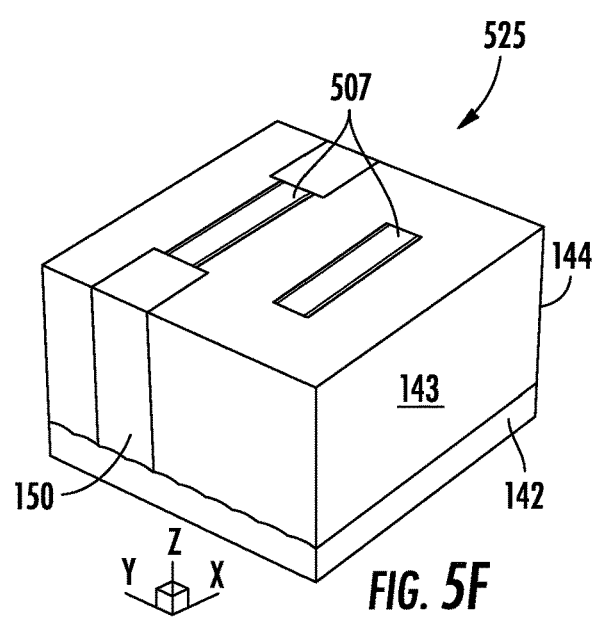

FIG. 5F illustrates a subsequent stage of fabrication to produce the semiconductor device structure 160 in FIG. 1E. For the semiconductor device structure 525, the volumes 150 include the hot ions such as hot helium ions implemented through the mask 524 and the mask 524 is removed from the top of the isolation oxide layer 143. The hot ion implantation in the volumes 150 may add compressive stress on the fins 146. The volume 144 of the isolation oxide layer 143 remains unaffected by the hot ion implantation so the tensile stress from the CVD of the isolation oxide remains parallel with the fins 148 to form channels for the NFETs. Furthermore, the hard masks 507 on the fins 146 and 148 attenuate negative effects associated with the tensile stress perpendicular to the fins 146 and 148 by preventing or attenuating, e.g., fin bending.

Figure 5G:
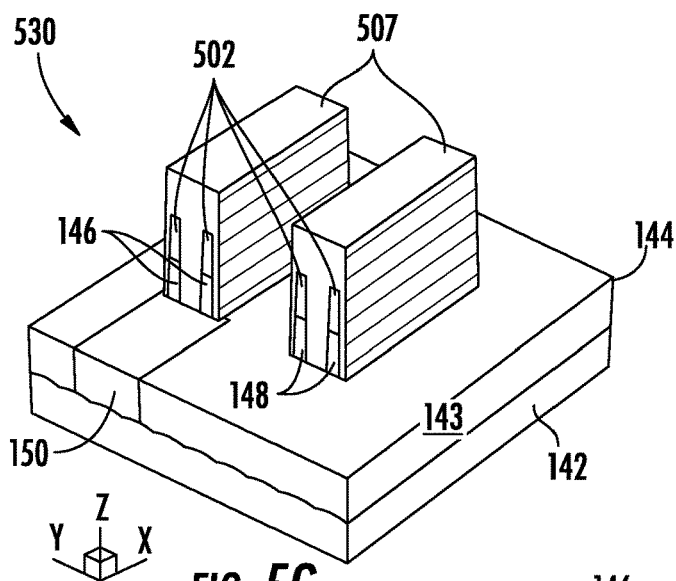
Figure 5H:
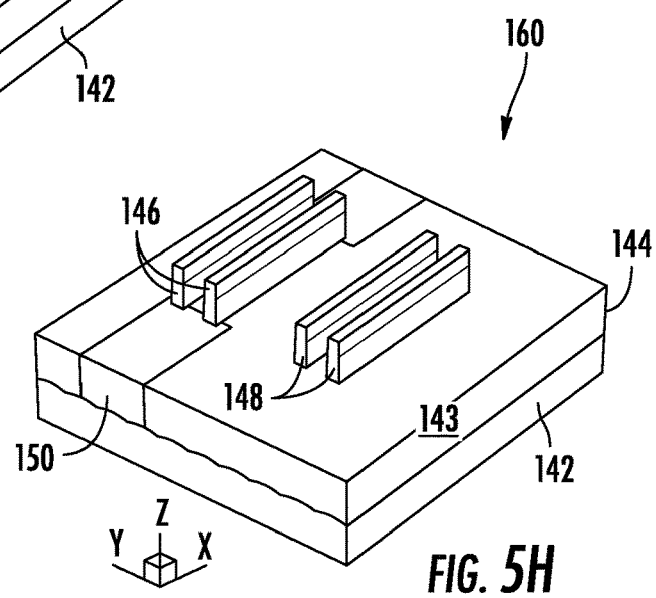

In FIG. 5G, the isolation oxide layer 143 is recessed to reveal the fins 146 and 148 covered in the hard mask 507 to form the semiconductor device structure 530. In FIG. 5H, the hard mask 507 is removed by, e.g., etching, to reveal the fins 146 and 148 to form the semiconductor device structure 160 illustrated in FIG. 1E.

Figure 6:
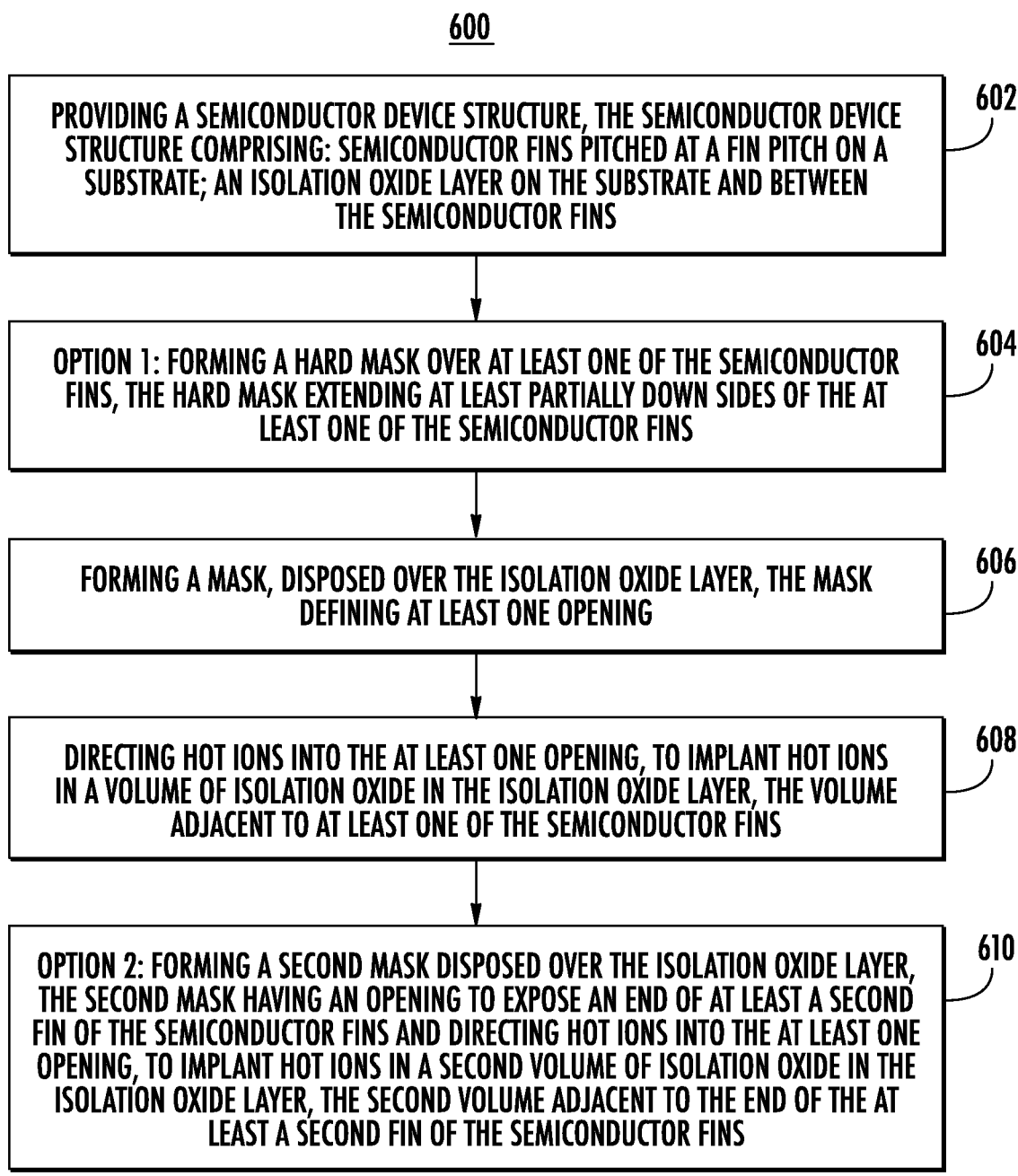
FIG. 6 shows an exemplary process flow, according to further embodiments of the disclosure.

FIG. 6 depicts an exemplary process flow 600, according to embodiments of the disclosure. At block 602, a semiconductor device structure is provided. The semiconductor device structure comprises semiconductor fins pitched at a fin pitch on a substrate. The semiconductor device structure further comprises an isolation oxide disposed on a substrate and between the plurality of semiconductor fins.

At block 604, a hard mask may optionally be formed over the at least one of the semiconductor fins. In many embodiments, the hard mask forms over all the fins within an area of a semiconductor for building an NFET and a PFET. The isolation oxide layer may be partially recessed, and the hard mask may extend into the recess, down the sides of the semiconductor fins. If the fins have not previously been cut to form a pair of fins for NFETs and a pair of fins for PFETs, the fins may be cut by, e.g., etching.

At block 606, an isolation oxide layer forms via CVD of an isolation oxide and a mask is disposed over the isolation oxide layer including the hard mask, if applicable.

At block 608, hot ions are directed into the at least one opening, to implant hot ions in a volume of isolation oxide in the isolation oxide layer. The volume is adjacent to at least one of the semiconductor fins to counteract a tensile stress on the at least one semiconductor fin and/or to add a compressive stress to the at least one semiconductor fin. In some embodiments, the volume is adjacent to the end of the at least one fin. In further embodiments, the volume is adjacent to the sides of the at least one fin and the sides of at least a second fin of the semiconductor fins.

At block 610, a second mask is optionally formed over the isolation oxide layer. In many embodiments, block 610 is not performed if the hard mask is formed at the block 604. The second mask may have an opening to expose an end of at least a second fin of the semiconductor fins and an ion implanter may direct hot ions into the at least one opening, to implant hot ions in a second volume of isolation oxide in the isolation oxide layer. The second volume may be adjacent to the end of the at least the second fin of the semiconductor fins.

Figure 7:
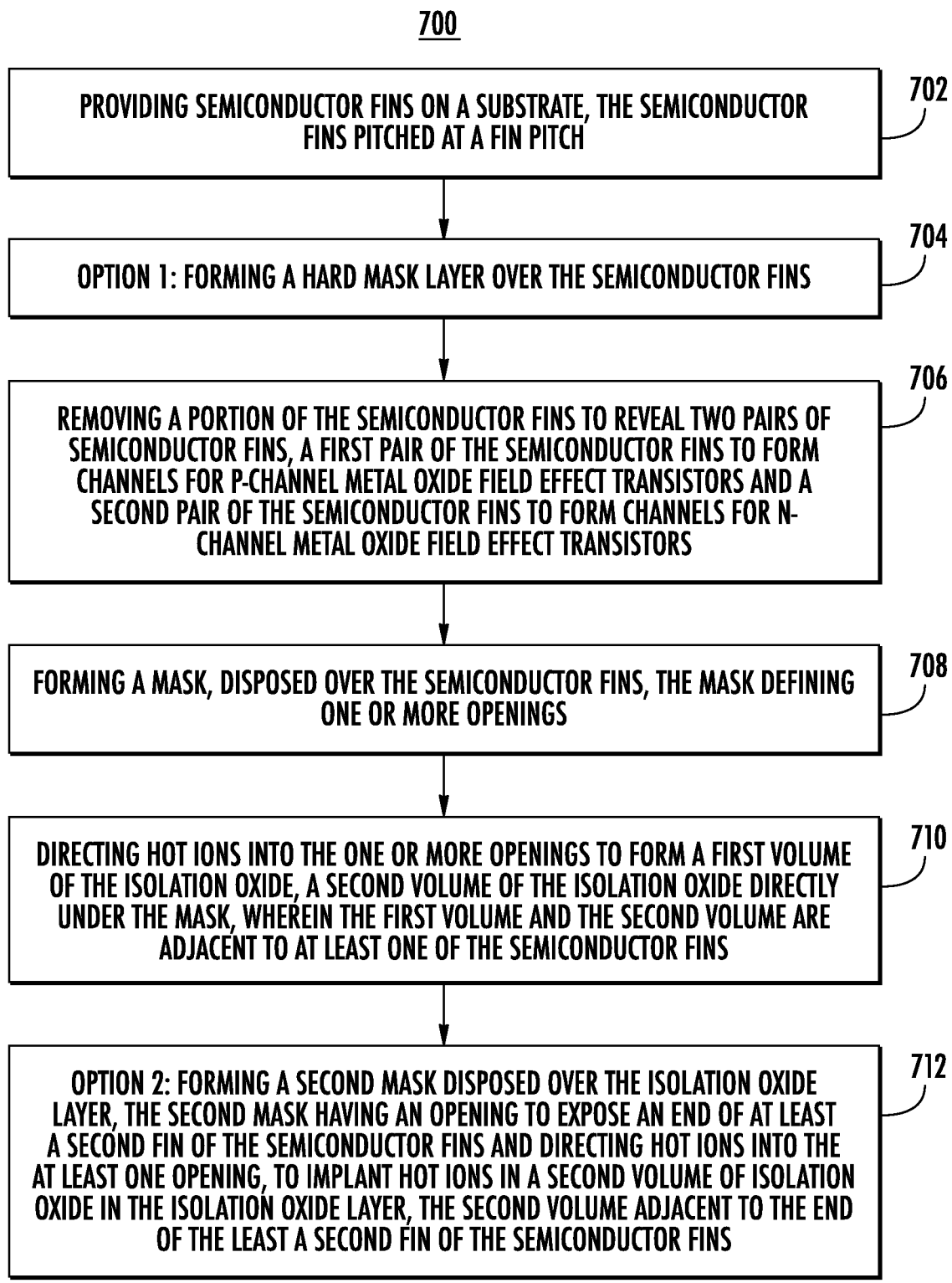
FIG. 7 shows another exemplary process flow, according to further embodiments of the disclosure.

FIG. 7 depicts an exemplary process flow 700, according to embodiments of the disclosure. At block 702, a semiconductor device structure is provided, comprising multiple semiconductor fins on a substrate with an isolation oxide layer between the fins. The multiple semiconductor fins may be pitched at a fin pitch and the isolation oxide layer may be partially recessed between the fins to expose a portion of the sides of the fins.

At block 704, a hard mask may optionally be formed over the semiconductor fins and the hard mask may extend through the recess between the semiconductor fins to partially cover the sides of the fins. Many embodiments include more fins in an area for, e.g., a static random access memory (SRAM) unit cell than needed so, at block 706, the excess fins are removed to reveal two pairs of semiconductor fins. A first pair of the semiconductor fins may form channels for p-channel metal oxide field effect transistors (PFETs) and a second pair of the semiconductor fins to form channels for n-channel metal oxide field effect transistors (NFETs).

At block 708, a mask is formed. The mask may be disposed over the semiconductor fins and the mask may define a plurality of openings. The mask, for instance, may comprise a photoresist. The photoresist, when exposed to a pattern of ultraviolet light, forms soluble and non-soluble areas. The soluble areas may dissolve upon application of a solution to expose an area of the surface of the isolation oxide layer through an area of the mask.

At block 710, hot ions are directed into the one or more openings to form a first volume of the isolation oxide layer implanted with hot ions and a second volume of the isolation oxide layer directly under the mask not implanted with hot ions. Furthermore, the first volume and the second volume may be adjacent to at least one of the semiconductor fins. For instance, the first volume may comprise a volume of the isolation oxide layer at an end of a pair of fins to form PFETs and the second volume may comprise a volume of the isolation oxide layer at a side of at least one of the fins in the pair of fins to form PFETs. The second volume may also be adjacent to the sides and ends of the pair of fins to form NFETs.

As another example, the first volume may comprise a volume of the isolation oxide layer at a side and an end of a pair of fins to form PFETs as well as a side of a pair of fins to form NFETs. The second volume may comprise a volume of the isolation oxide layer at an end of the pair of fins to form NFETs.

At block 712, a second mask may optionally be formed or disposed over the isolation oxide layer. The second mask may have an opening to expose an end of at least a second fin of the semiconductor fins and an ion implanter may direct hot ions into the at least one opening, to implant hot ions in a second volume of isolation oxide in the isolation oxide layer. The second volume may be adjacent to the end of the at least a second fin of the semiconductor fins.

Embodiments herein describe a method and device for shallow trench isolation in a fin type field effect transistors. The method and device advantageously include implantation of hot ions in selected portions of an isolation oxide layer on the substrate and between the fins to adjust tensile stresses caused on the fins by the process of densification and annealing of the isolation oxide layer. The tensile stresses can have an adverse effect on the channel mobility of fin type field effect transistors. Implantation of the hot ions at the ends of the fins and the sides of the fins can, advantageously, neutralize the tensile stresses to decrease adverse effects such as fin bending and limitation of compressive stress. Implantation of the hot ions at the ends of the fins can, advantageously, add compressive stresses to increase channel mobility. And selective implantation of the hot ions in volumes of isolation oxide other than at the ends of the fins can, advantageously, increase channel mobility for n-channel field effect transistors.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a semiconductor device, comprising:
    providing a semiconductor device structure, the semiconductor device structure comprising:
        semiconductor fins pitched at a fin pitch on a substrate;
        an isolation oxide layer on the substrate and between the semiconductor fins;
        a mask, disposed over the isolation oxide layer, the mask defining a at least one opening;
    forming a hard mask layer over the semiconductor fins;
    removing a portion of the semiconductor fins to reveal two pairs of the semiconductor fins, a first pair of the semiconductor fins to form channels for p-channel metal oxide field effect transistors and a second pair of the semiconductor fins to form channels for n-channel metal oxide field effect transistors;
    forming the isolation oxide layer on the substrate and between the semiconductor fins;
    forming the mask with the at least one opening over ends of the first pair of the semiconductor fins;
    directing hot ions into the at least one opening, to implant hot ions in a volume of isolation oxide in the isolation oxide layer, the volume adjacent to at least one of the semiconductor fins; and
    removing the hard mask.

2. The method of claim 1, further comprising forming a second mask disposed over the isolation oxide layer, the second mask having an opening to expose an end of at least a second fin of the semiconductor fins and directing hot ions into the at least one opening, to implant hot ions in a second volume of isolation oxide in the isolation oxide layer, the second volume adjacent to the end of the at least a second fin of the semiconductor fins.

3. The method of claim 1, wherein the hard mask extends at least partially down sides of the at least one of the semiconductor fins.

4. The method of claim 1, wherein the directing the hot ions into the at least one opening comprises directing hot ions into the volume of the isolation oxide at an atomic concentration to attenuate or neutralize a tensile stress imposed on the at least one of the semiconductor fins via densification and annealing of an isolation oxide adjacent to the at least one of the semiconductor fins.

5. The method of claim 1, wherein the directing the hot ions into the at least one opening comprises directing hot ions into the volume of the isolation oxide at an atomic concentration to add a compressive stress in parallel with the at least one of the semiconductor fins.

6. The method of claim 5, wherein the mask is disposed over a second volume of isolation oxide in the isolation oxide layer, the second volume of isolation oxide adjacent to an end of at least a second one of the semiconductor fins.

7. The method of claim 6, wherein the at least one opening is disposed over the second volume of isolation oxide in the isolation oxide layer.

* * * * *